US011764028B2

(12) United States Patent
Imai et al.

(10) Patent No.: US 11,764,028 B2
(45) Date of Patent: Sep. 19, 2023

(54) CHARGED PARTICLE BEAM DEVICE AND AXIS ADJUSTMENT METHOD THEREOF (71) Applicant: Hitachi High-Tech Corporation, Tokyo (JP)

(72) Inventors: Yuta Imai, Tokyo (JP); Masahiro Sasajima, Tokyo (JP); Yoshihiro Takahoko, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 320 days.

(21) Appl. No.: 17/056,993

(22) PCT Filed: May 22, 2018

(86) PCT No.: PCT/JP2018/019568
§ 371 (c)(1),
(2) Date: Nov. 19, 2020

(87) PCT Pub. No.: WO2019/224895
PCT Pub. Date: Nov. 28, 2019

(65) Prior Publication Data
US 2021/0151279 A1 May 20, 2021

(51) Int. Cl.
H01J 37/14 (2006.01)
H01J 37/15 (2006.01)
(Continued)

(52) U.S. Cl.
CPC ............ *H01J 37/145* (2013.01); *H01J 37/15* (2013.01); *H01J 37/21* (2013.01); *H01J 37/12* (2013.01); *H01J 37/141* (2013.01); *H01J 37/28* (2013.01)

(58) Field of Classification Search
CPC .......... H01J 37/145; H01J 37/15; H01J 37/21; H01J 37/12; H01J 37/141; H01J 37/28
See application file for complete search history.

(56) References Cited

U.S. PATENT DOCUMENTS 9,659,739 B2 * 5/2017 Bathe ................... H01J 35/147
2008/0230694 A1 * 9/2008 Frosien ................. H01J 37/12
250/398

(Continued)

FOREIGN PATENT DOCUMENTS

JP 6-151289 A 5/1994
JP 2000-173519 A 6/2000
JP 2013-254736 A 12/2013

OTHER PUBLICATIONS

International Search Report (PCT/ISA/210) issued in PCT Application No. PCT/JP2018/019568 dated Jul. 17, 2018 with English translation (two (2) pages).

(Continued)

Primary Examiner — Nicole M Ippolito
(74) Attorney, Agent, or Firm — Crowell & Moring LLP (57) ABSTRACT A charged particle beam device is provided in which axis adjustment as a superimposing lens is facilitated by aligning an axis of an electrostatic lens resulting from a deceleration electric field with an axis of a magnetic field lens. The charged particle beam device includes: an electron source; an objective lens that focuses a probe electron beam from the electron source on a sample; a first beam tube and a second beam tube through each of which the probe electron beam passes; a deceleration electrode arranged between the first beam tube and a sample; a first voltage source that forms a deceleration electric field for the probe electron beam between the first beam tube and the deceleration electrode by applying a first potential to the first beam tube; and a first moving mechanism that moves a position of the first beam tube.

8 Claims, 5 Drawing Sheets (51) Int. Cl.
*H01J 37/21* (2006.01)
*H01J 37/28* (2006.01)
*H01J 37/145* (2006.01)
H01J 37/12 (2006.01)
H01J 37/141 (2006.01)

(56) References Cited

U.S. PATENT DOCUMENTS

2009/0200463 A1* 8/2009 Degenhardt .......... H01J 37/244
250/311
2013/0327951 A1 12/2013 Frosien
2017/0336335 A1* 11/2017 Hendrich ............. H01J 37/263

OTHER PUBLICATIONS

Japanese-language Written Opinion (PCT/ISA/237) issued in PCT Application No. PCT/JP2018/019568 dated Jul. 17, 2018 (three (3) pages).
German-language Office Action issued in German Application No. 11 2018 007 506.0 dated Jun. 28, 2023 with English translation (13 pages).
Plies, E. et al., "Experimental results using a 'low-voltage booster' in a conventional SEM", Nuclear Instruments and Methods in Physics Research A, 1999, pp. 126-130, vol. A 427, Elsevier (5 pages).

* cited by examiner

CHARGED PARTICLE BEAM DEVICE AND AXIS ADJUSTMENT METHOD THEREOF

TECHNICAL FIELD

The present invention relates to a charged particle beam device and an axis adjustment method thereof.

BACKGROUND ART

A scanning electron microscope (SEM) obtains a two-dimensional image of a scanning area on a sample surface by detecting signal electrons generated when a sample is scanned by being irradiated with a focused probe electron beam, and displaying a signal intensity of each irradiation position in synchronization with a scanning signal of an irradiation electron beam.

In recent years, low-acceleration observation with irradiation energy of about 1 keV or less is more and more important for a purpose of obtaining sample information on an extreme surface while avoiding charging or damage of the sample caused by electron beam irradiation during an SEM observation. However, chromatic aberration generally increases in a low acceleration region, and it is difficult to obtain high resolution. In order to reduce this chromatic aberration, there is known a deceleration optical system in which the sample is irradiated by accelerating the probe electron beam to pass through an objective lens at a high speed and decelerating the probe electron beam immediately before the sample.

In a method called a boosting method in the deceleration optical system, a cylindrical electrode for applying a positive voltage is provided along an inner wall of an inner magnetic path of the objective lens of the SEM, and the sample is set to a ground potential. In a method called a retarding method, an objective lens side of an SEM column is kept at the ground potential and a negative voltage is applied to the sample. It is characterized that in any method, a passage area of the probe electron beam from the objective lens side to an electron source side has a higher potential than the sample, and an electric field formed by this potential difference and decelerating the probe electron beam toward the sample is used as a lens field. By superimposing an electrostatic lens resulting from a decelerating electric field and a magnetic field lens resulting from a magnetic field of the objective lens, aberration can be reduced in the low acceleration region and the high resolution can be obtained.

In the deceleration optical system, both the electrostatic lens and the magnetic field lens that are superposed determine an irradiation system performance. In particular, in a low acceleration voltage region, an influence of the electrostatic lens is large. Therefore, in order to obtain a best performance, it is necessary to guide the probe electron beam to a lens center of each of the magnetic field lens and the electrostatic lens that are superimposed. This is because, when the probe electron beam passes through a portion (off-axis) deviated from the lens center, off-axis aberration occurs, which adversely affects a spot formation of the irradiation electron beam.

As an adjustment method for causing the probe electron beam to pass a center of the magnetic field lens, current center axis adjustment that is performed by minimizing an image movement amount when an excitation current of the objective lens is periodically changed is often used. Thus, the off-axis aberration of the magnetic field lens can be minimized. In addition, since image movement does not occur during focus adjustment during image acquisition, operability of the focus adjustment is improved.

On the other hand, as an adjustment method for causing the probe electron beam to pass a center of the electrostatic lens, voltage center axis adjustment that minimizes an image movement amount when an applied voltage of electrodes forming an electric field of the electrostatic lens is periodically changed is used. Thus, it is possible to minimize the chromatic aberration generated in the electrostatic lens.

PTL 1 discloses a configuration in which in an electron beam apparatus including the deceleration optical system, an electron beam trajectory is deflected by using an electromagnetic aligner, and axis adjustment can be performed. Specifically, a deflector is arranged between the electrodes forming the electrostatic lens and the objective lens forming the magnetic field lens, and the probe electron beam is guided to the center of the electrostatic lens.

CITATION LIST

Patent Literature

PTL 1: JP-A-2000-173519

SUMMARY OF INVENTION

Technical Problem

In the charged particle beam device, optical axis adjustment for guiding the probe electron beam to the center of the electrostatic lens or the magnetic field lens by deflecting the trajectory of the irradiation electron beam that enters the lens field using the electromagnetic aligner is often performed. However, in an optical system such as the deceleration optical system in which the electrostatic lens and the magnetic field lens are superimposed, there is no guarantee that the axis of the electrostatic lens and the axis of the magnetic field lens are linearly aligned in advance, and in many cases the axes are not aligned. Therefore, there is a problem that the axis adjustment as a superimposing lens cannot be sufficiently performed only by deflecting the electron beam trajectory.

In addition, in the axis adjustment method disclosed in PTL 1, it is necessary to arrange the deflector between the objective lens forming the magnetic field lens and the electrodes forming the electrostatic lens. However, it is desirable to arrange the objective lens as close to the sample as possible in order to reduce a focal length and the aberration. Therefore, when the deflector is arranged between the electrostatic lens and the magnetic field lens, a mechanical constraint thereof reduces a degree of freedom in designing an objective lens structure, and as a result, it is difficult to bring the magnetic field lens or the electrostatic lens sufficiently close to the sample.

Solution to Problem

In order to solve the above problem, a configuration described in the claims is adopted. For example, a charged particle beam device according to an embodiment includes: an electron source; an objective lens that focuses a probe electron beam from the electron source on a sample; a first beam tube and a second beam tube through each of which the probe electron beam passes; a deceleration electrode arranged between the sample and the first beam tube arranged closer to an objective lens side than the second beam tube; a first voltage source that forms a deceleration electric field for the probe electron beam between the first beam tube and the deceleration electrode by applying a first potential to the first beam tube; and a moving mechanism that moves a position of the first beam tube.

Advantageous Effect

A charged particle beam device can be provided in which axis adjustment as a superimposing lens is facilitated by aligning an axis of an electrostatic lens resulting from the deceleration electric field with an axis of a magnetic field lens.

Other technical problems and novel characteristics will be apparent from a description of the present description and the accompanying drawings.

DESCRIPTION OF EMBODIMENTS

Hereinafter, embodiments of the invention will be described with reference to the accompanying drawings. Although the accompanying drawings show specific embodiments in accordance with the principles of the invention, the embodiments are provided for the purpose of understanding the invention, and are not to be used for limiting interpretation of the invention. In all the drawings showing the embodiments and the modifications, those having the same function are designated by the same reference numerals, and the repeated description thereof will be omitted.

Embodiment 1

Figure 1:
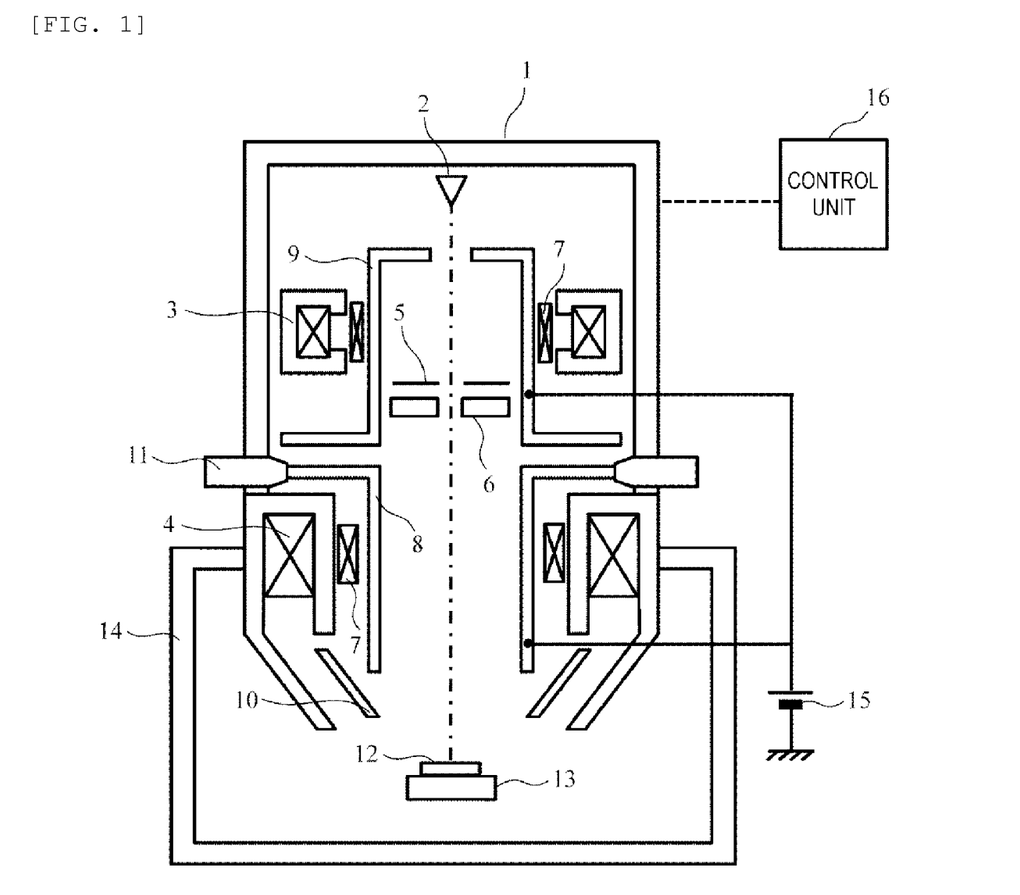
FIG. 1 is a schematic cross-sectional view showing a charged particle beam device according to a first embodiment.

FIG. 1 is a schematic cross-sectional view showing a charged particle beam device according to a first embodiment. An SEM to which a boosting method is applied is shown as an example of the charged particle beam device. An SEM column 1 includes an electron source 2 including a mechanism for irradiating a sample 12 with a probe electron beam, an aperture 5 for limiting a diameter of the probe electron beam, electronic lenses such as a condenser lens 3 or an objective lens 4, deflectors 7 for causing the sample 12 to be scanned with the probe electron beam, and a detector 6 for detecting signal electrons generated from the sample 12. The objective lens 4 forms a magnetic field lens for focusing the probe electron beam on the sample 12 by generating a magnetic field using, for example, a coil. The SEM column 1 may include other components (a lens, an electrode, a detector, or the like) other than the above, and is not limited to the above configuration.

Further, the SEM includes a sample chamber 14. The sample chamber 14 is provided with a sample table 13 on which the sample 12 is mounted. The sample table 13 includes a mechanism for tilting and moving the sample 12, and an observation region of the sample 12 can be determined by this mechanism. In addition, the SEM includes a vacuum exhaust facility (not shown) for vacuum exhausting the sample chamber 14 and the SEM column 1.

The SEM also includes a control unit 16 that controls an entire SEM. The control unit 16 controls each component of the SEM and executes various information processing. The control unit 16 includes an image display device (not shown), and displays an SEM image generated based on information obtained from the detector 6 on the image display device.

The control unit 16 may be implemented by using, for example, a general-purpose computer, or may be implemented as a function of a program executed on the computer. The computer includes at least a processor such as a central processing unit (CPU), a storage unit such as a memory, and a storage device such as a hard disk. A processing of the control unit 16 may be realized by storing a program code in the memory and causing the processor to execute each program code. A part of the control unit 16 may be configured with hardware such as a dedicated circuit board.

The objective lens 4 of the SEM column 1 is an out-lens type having a smaller leakage magnetic field with respect to the sample 12. In addition, the SEM column 1 includes a boosting means as the deceleration optical system. Specifically, in the SEM column 1, a cylindrical second beam tube 9 is provided from the electron source 2 along an optical axis, and a first beam tube 8 is provided along an inner wall of an objective lens magnetic path of the objective lens 4. In addition, a voltage source (a boosting voltage source) 15 for applying a boosting voltage to the first beam tube 8 and the second beam tube 9 is provided. A voltage from the boosting voltage source 15 is controlled by the control unit 16. In addition, a deceleration electrode 10 is provided at a tip portion of the objective lens. The first beam tube 8 and the second beam tube 9 are set to a higher potential than the deceleration electrode 10 by applying the voltage from the boosting voltage source 15. Thus, a decelerating electric field for the probe electron beam is formed between a sample-side end portion of the first beam tube 8 and the deceleration electrode 10, and the probe electron beam is decelerated by a lens action when passing through this electric field.

In particular, in order to obtain high resolution under an observation condition where irradiation energy of the probe electron beam is 5 keV or less, it is necessary to set the first beam tube 8 to a high potential with respect to the sample 12 and form the deceleration electric field. For example, a potential difference between the sample 12 and the first beam tube 8 is set to about 10 kV. As strength of the leakage electric field from the SEM column 1 increases, an electrostatic lens action having a shorter focal length can be obtained near the sample 12. Thus, aberration is reduced and an effect of improving resolution is enhanced.

In addition, the deceleration electrode 10 may form a part of the objective lens 4. The deceleration electrode 10 may be formed of a magnetic material and may be magnetically coupled to the objective lens magnetic path, or the objective lens magnetic path and the deceleration electrode 10 may be configured to function as one magnetic circuit.

In order to obtain a best irradiation system performance in the SEM, axis adjustment that properly adjusts a path that passes the lenses of the probe electron beam is required. In particular, in the SEM including the deceleration optical system as in this embodiment and using the magnetic field lens and the electrostatic lens in a superimposing manner, when the probe electron beam passes through a portion deviated from a lens center axis of the electronic lenses, the irradiation system performance is deteriorated due to an effect of off-axis aberration of the lens. Since the irradiation system performance deteriorates in a case where the probe electron beam passes an off-axis portion of any of the electrostatic lens and the magnetic field lens, it is necessary to perform the axis adjustment such that axes of both the electrostatic lens and the magnetic field lens are aligned and the probe electron beam passes through the center.

In this embodiment, the axis adjustment of a superimposing lens is performed by moving an optical axis of the electrostatic lens. A position of the optical axis of the electrostatic lens is determined by a positional relationship between the first beam tube 8 and the deceleration electrode 10. Therefore, by moving a position of the first beam tube 8, adjustment of an electrostatic lens axial position can be realized. Therefore, in this configuration, a moving mechanism 11 capable of mechanically moving the position of the first beam tube 8 that forms the decelerating electric field is provided.

The first beam tube 8 needs to be movable by the moving mechanism 11 while maintaining electrical insulation from the objective lens magnetic path or the deceleration electrode 10. A structure may be employed in which a gap is provided between the first beam tube 8 and the objective lens magnetic path or the deceleration electrode 10 and a space therebetween is insulated. In addition, an electrically insulated structure in which a deformable insulator is interposed between the first beam tube and the objective lens magnetic path or the deceleration electrode 10 may be adopted. With such a structure, it is possible to move the position of the first beam tube 8 in a state where a high voltage is applied to the first beam tube 8.

Figure 2:
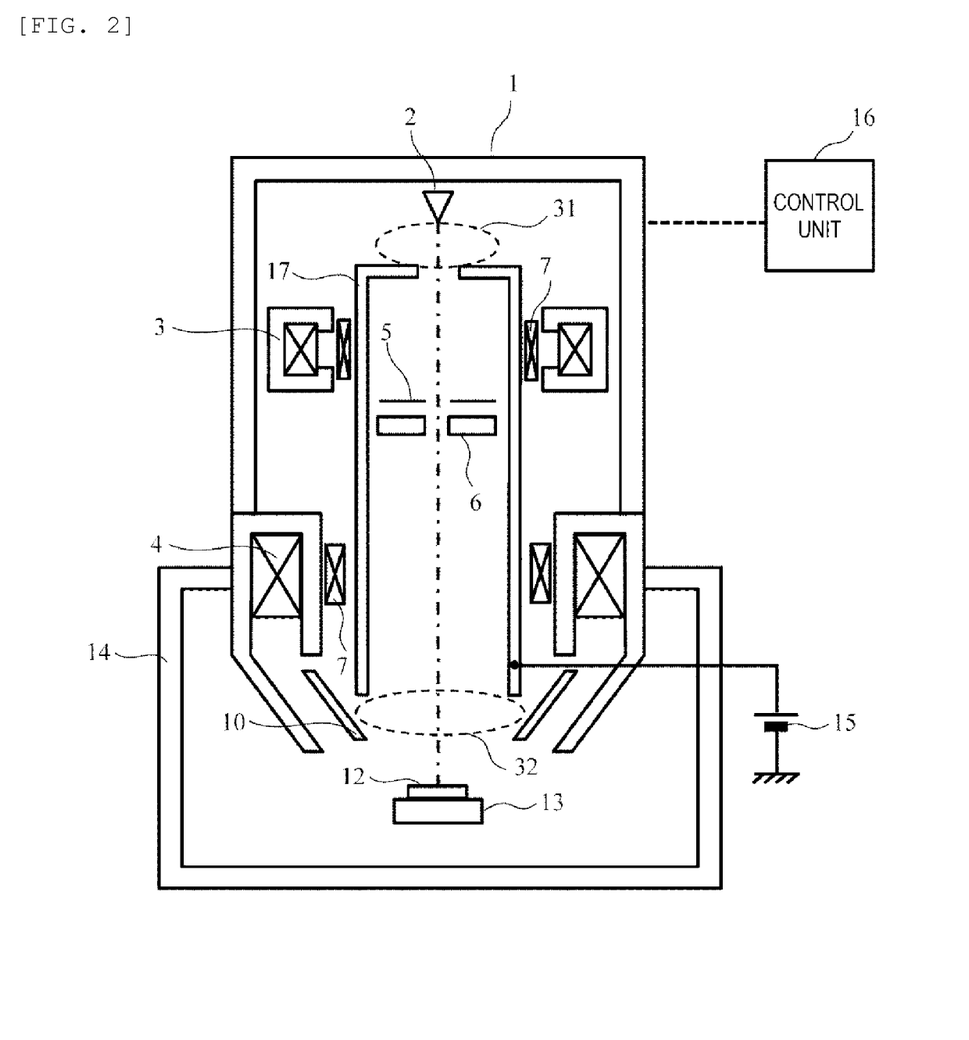
FIG. 2 is a schematic cross-sectional view showing a charged particle beam device including a deceleration optical system in the related art.

As a comparative example, a schematic view of an SEM column provided with a deceleration optical system in the related art is shown in FIG. 2. Compared with a configuration of FIG. 1, a configuration is employed in which a beam tube 17 to which a high potential is applied is not divided, an accelerating electric field is formed at an end portion on an electron source side and a decelerating electric field is formed at an end portion on a sample side with respect to the probe electron beam, and each electric field has a lens action. When the probe electron beam does not pass through a center of an acceleration lens 31, off-axis aberration occurs and adversely affects an irradiation system. Therefore, when the axis adjustment of an optical system is performed, first, an electron beam trajectory is guided such that the probe electron beam passes through the center of the acceleration lens 31. For example, movement of a position of the electron source 2 and trajectory deflection using an electromagnetic deflector are often performed.

On the other hand, as described above, it is also necessary to adjust an axis of a deceleration lens 32 that is superimposed with the magnetic field lens and that is formed at a sample-side end portion of the beam tube. Although the beam tube 17 is fixed in the SEM column in the related art, when it is assumed that the beam tube 17 can be moved and the beam tube 17 is moved to adjust a center position of the deceleration lens 32, as a result, not only the center of the deceleration lens 32 but also the center of the acceleration lens 31 moves at the same time. That is, the deceleration lens 32 alone cannot be adjusted independently, and the axis adjustment of the deceleration lens 32 causes axial misalignment in the acceleration lens 31. Actually, the probe electron beam does not go straight along a line vertically dropped from the electron source 2 toward the sample 12 as shown in FIG. 2, but goes toward the sample while a traveling direction is bent by the deflector or lens provided in the SEM column. Therefore, an incident angle of the probe electron beam to the acceleration lens 31 and an incident angle to the deceleration lens 32 are usually different from each other, and it is not realistic that axial positions of the acceleration lens 31 and the deceleration lens 32 can be optimized at the same time by position adjustment of one beam tube 17.

It is one of characteristics in the device of the first embodiment shown in FIG. 1, that the beam tube to which the high potential is applied is provided and divided into two, the first beam tube 8 on the sample side and the second beam tube 9 on the electron source side. Due to the division, the position of the second beam tube 9 does not change even when the first beam tube 8 is moved. Therefore, the position of the deceleration lens formed at the sample-side end portion of the first beam tube 8 can be adjusted without changing the position of the acceleration lens formed at the electron source-side end portion of the second beam tube 9. In other words, it is possible to prevent an occurrence of the axial misalignment of the acceleration lens during the position adjustment of the deceleration lens.

At least during the axis adjustment, it is necessary to keep the first beam tube 8 and the second beam tube 9 at the same potential. When a potential of the first beam tube 8 and a potential of the second beam tube 9 are different, an electric field having a lens action occurs between two beam tubes. Due to movement of the first beam tube 8 in this situation, an axial misalignment of the electrostatic lens between the first beam tube 8 and the second beam tube 9 occurs. In order to avoid the axial misalignment, the potentials of the first beam tube 8 and the second beam tube 9 are set to the same potential during the axis adjustment. Since no electric field is formed between beam tubes of the same potential, no lens action occurs. Therefore, the axial adjustment of only the deceleration lens formed between the first beam tube 8 and the deceleration electrode 10 can be performed by moving the position of the first beam tube 8.

As will be described later, it is desirable to perform the axis adjustment by moving the position of the first beam tube 8 while visually recognizing the image. Therefore, it is desirable that the moving mechanism 11 of the first beam tube 8 is a mechanism that can adjust the first beam tube 8 from an outside of the SEM column 1. Thus, it is easier to perform the axis adjustment while visually recognizing the image. The moving mechanism 11 may be, for example, a mechanism that moves the first beam tube 8 by pushing a rod-shaped instrument such as a screw through an elongated hole formed in an outer wall of the column located outside the first beam tube 8. In addition, some of the screws may have spring properties, or the position adjustment may be performed by using a dedicated jig.

In this configuration, the axis of the electrostatic lens is aligned with the axis of the magnetic field lens by moving the first beam tube 8. Therefore, even when a trajectory of the probe electron beam changes due to changes in an accelerating voltage or a probe current, the axes of the electrostatic lens and the magnetic field lens are kept aligned. Therefore, it is possible to obtain a best performance by deflecting the probe electron beam trajectory by the deflector and guiding the trajectory to an aligned axis of the electrostatic lens and the magnetic field lens. The deflector that changes the probe electron beam trajectory may be a magnetic field type using a coil or an electrostatic type using a pair of electrodes.

An axis adjustment procedure in this embodiment will be described.

(1) At first, the probe electron beam trajectory is aligned with a current center axis of the objective lens 4 (the magnetic field lens). First, the objective lens 4 is driven to focus the probe electron beam on the sample 12. When an excitation current of an objective lens coil is changed periodically, the image moves in synchronization with the change of the excitation current. A position of the electron source 2 or the deflector 7 is adjusted to change the probe electron beam trajectory in order to minimize a movement of the image. At this stage, lenses other than the objective lens are not operated, and the potentials of the first beam tube 8 and the second beam tube 9 are also set to a reference potential (GND).

Next, the condenser lens 3 is set to a predetermined excitation amount, the excitation current supplied to the objective lens 4 is periodically changed again, and a position of the condenser lens 3 or the deflector 7 is adjusted to change the probe electron beam trajectory in order to minimize the movement of the image. The condenser lens 3 has a function of adjusting an aperture amount to obtain a desired irradiation current amount. It is acceptable as long as the excitation amount set at this time is set so as to have appropriate optical conditions according to a material to be observed, for example.

As described above, since the probe electron beam passes through the current center axis of the objective lens 4, a movable aperture 5 is finally inserted such that the probe electron beam passes through a center of the movable aperture 5. Again, the excitation current supplied to the objective lens 4 is periodically changed and a position of the movable aperture 5 is changed to minimize the movement of the image. As described above, the probe electron beam is adjusted to pass through the current center axis of the magnetic field lens formed by the objective lens 4.

(2) At the second, the optical axis of the deceleration lens (the electrostatic lens) is aligned with the current center axis of the objective lens 4 (the magnetic field lens). A predetermined voltage is applied to the first beam tube 8 and the second beam tube 9. The objective lens 4 and the condenser lens 3 are driven, and the probe electron beam is focused on the sample in a state of the aperture 5 is inserted. The excitation current supplied to the objective lens 4 is periodically changed and the position of the first beam tube 8 is adjusted by the moving mechanism 11 in order to minimize the movement of the image. Thus, the current center axis of the objective lens 4 (the magnetic field lens) and the optical axis of the deceleration lens (the electrostatic lens) are aligned with each other.

(3) In addition to the above adjustment, it is desirable to perform adjustment of aligning the current center axis of the objective lens 4 (the magnetic field lens) with a voltage center axis of the deceleration lens (the electrostatic lens). In this case, (3-1) the aperture 5 is moved or the deflector 7 is adjusted to change the probe electron beam trajectory in order to minimize the movement of the image caused by periodically changing the voltage applied to the first beam tube 8. (3-2) Next, the position of the first beam tube 8 is adjusted in order to minimize the movement of the image caused by periodically changing the excitation current supplied to the objective lens 4. (3-3) Procedures of the adjustment (3-1) and the adjustment (3-2) are performed repeatedly.

By the above adjustment (3), the current center axis of the magnetic field lens and the voltage center axis of the electrostatic lens are aligned, and the probe electron beam is adjusted to pass through the current center axis of the magnetic field lens and the voltage center axis of the electrostatic lens that are aligned.

Figure 3:
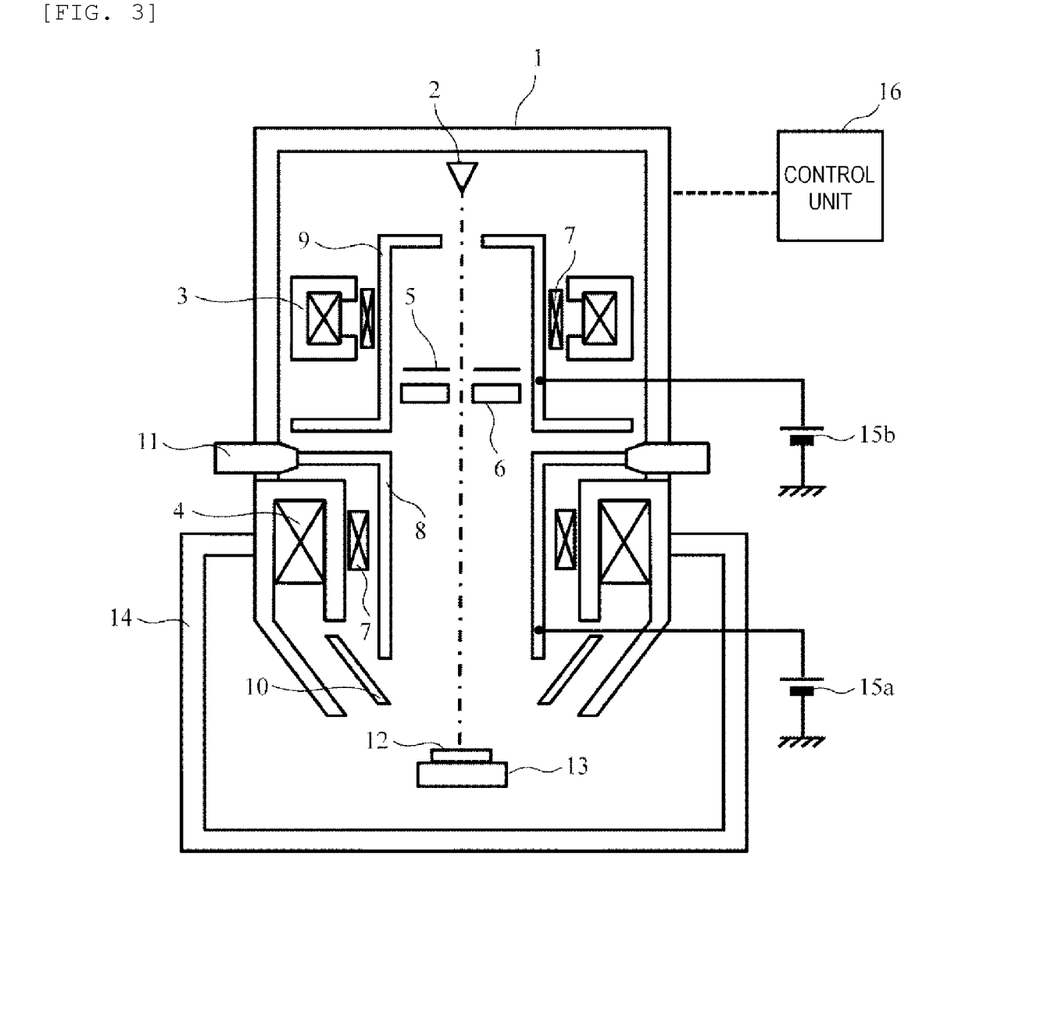
FIG. 3 is a schematic cross-sectional view showing a modification of the charged particle beam device according to the first embodiment.

FIG. 3 shows a modification in which the first beam tube 8 and the second beam tube 9 are provided with different voltage sources in the charged particle beam device according to the present embodiment. A first voltage source 15a is connected to the first beam tube 8 and a second voltage source 15b is connected to the second beam tube 9. The potential applied by each voltage source is controlled by the control unit 16. The control unit 16 includes a mode in which the voltage sources 15a and 15b are controlled such that the potentials of the first beam tube 8 and the second beam tube 9 are the same potential.

In an axis adjustment procedure in the present modification, when the adjustment for aligning the axis of the deceleration lens formed between the first beam tube 8 and the deceleration electrode 10 with the axis of the objective lens (the magnetic field lens) is performed, the mode in which the potentials of the first beam tube 8 and the second beam tube 9 are set to the same potential is set. In the same potential mode, by moving the second beam tube 9 using the moving mechanism 11, the position of the deceleration lens can be adjusted alone.

In the present modification, the potentials of the first beam tube 8 and the second beam tube 9 are not limited to the same potential except during the adjustment, and can be set to any potential. Thus, it is possible to set an optimum potential for the irradiation system and a detection system according to requirements of an entire optical system. For example, when electron beam analysis is performed using a scanning electron microscope, a condition of setting the second beam tube 9 to a higher potential than the first beam tube 8 may be set for a purpose of improving electron source brightness and increasing the probe current. When the potentials of the first beam tube 8 and the second beam tube 9 are set to different potentials, the electrostatic lens is formed between the first beam tube 8 and the second beam tube 9, but an effect due to this formation can be compensated by using the deflector 7, for example.

Figure 4:
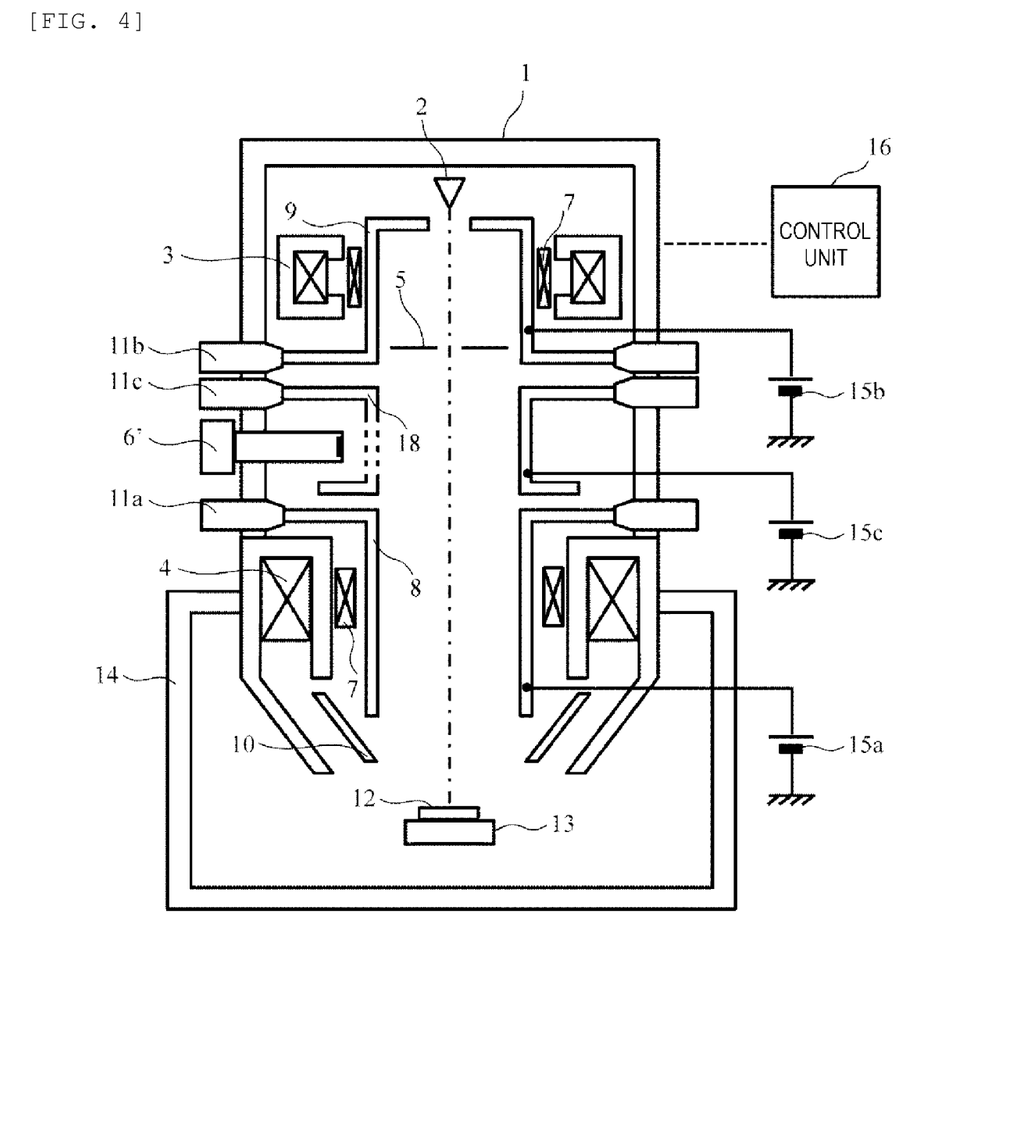
FIG. 4 is a schematic cross-sectional view showing a modification of the charged particle beam device according to the first embodiment.

Further, FIG. 4 shows a modification in which the beam tube is divided into three or more in the charged particle beam device of the present embodiment. For example, the beam tube is divided into three tubes, a sample-side beam tube (the first beam tube) 8, an intermediate beam tube (a third beam tube) 18, and an electron source-side beam tube (the second beam tube) 9, and moving mechanisms 11a to 11c and voltage sources 15a to 15c are provided for the respective beam tubes. In an example of FIG. 4, an example in which the moving mechanism 11 is also provided in the second beam tube 9 is shown, but this example is also applicable to other configuration examples such as FIG. 1.

The present modification is effective when it is necessary to set a potential of the path of the probe electron beam into a plurality of stages depending on the requirements of the irradiation system or the detection system. For example, a configuration is conceivable in which the intermediate beam tube 18 is set to a ground potential, and the sample-side beam tube 8 and the electron source-side beam tube 9 are set to the higher potential than the sample 12. In this case, a degree of freedom in designing the detection system is improved by providing a ground potential portion while obtaining an effect of improving the electron source brightness and an effect of reducing the aberration by boosting. A detector 6' provided at the ground potential may be, for example, a detector using a deflection field.

In the modification shown in FIG. 4, when the axis adjustment of the electrostatic lens is performed, the potentials given to the respective beam tubes are controlled such that single electrostatic lens adjustment is realized. For example, when the axis adjustment of the electrostatic lens formed between the sample-side beam tube 8 and the deceleration electrode 10 is performed, it is acceptable as long as the intermediate beam tube 18 and the sample-side beam tube 8 are set to the same potential, and the position of the sample-side beam tube 8 is moved. Similarly, for example, when the axis adjustment of the electrostatic lens formed between the intermediate beam tube 18 and the sample-side beam tube 8 is performed, it is acceptable as long as the electron source-side beam tube 9 and the intermediate beam tube 18 are set to the same potential, and the position of the intermediate beam tube 18 is moved. The potential applied by each voltage source is controlled by the control unit 16. The control unit 16 includes a mode in which the voltage sources 15a and 15c are controlled such that the potentials of the sample-side beam tube 8 and the intermediate beam tube 18 are set to the same potential, and a mode in which the voltage sources 15b and 15c are controlled such that the potentials of the electron source-side beam tube 9 and the intermediate beam tube 18 are set to the same potential. Thus, a configuration is obtained in which the axis of the electrostatic lens formed at an end portion of each beam tube can be adjusted using the moving mechanism 11.

The position at which the beam tube is divided is not limited unless otherwise there is a requirement from the irradiation system or the detection system. However, since a purpose of the beam tube is to originally keep an inside of the beam tube in a stable potential state, it is necessary to prevent the electric field from entering through the gap between divided beam tubes as much as possible. Therefore, in the present embodiment, both beam tubes are provided with flange portions at an end portion where the beam tubes are in contact with each other. For example, in the example of FIG. 1, a disk-shaped flange portion protruding from the end portion of the first beam tube 8 and a disk-shaped flange portion protruding from the end portion of the second beam tube 9 face each other, and thus an unintended electric field is prevented from entering through the gap between the first beam tube 8 and the second beam tube 9.

Embodiment 2

As a second embodiment, an SEM to which the retarding method is applied as the deceleration optical system will be described. There is no essential difference between a boosting optical system and a retarding optical system in that the decelerating electric field formed by the potential difference between the sample and a passage area of the probe electron beam on the electron source side from the objective lens. That is, the invention, which is effective in the boosting optical system, can also obtain the same effect in the retarding optical system.

Figure 5:
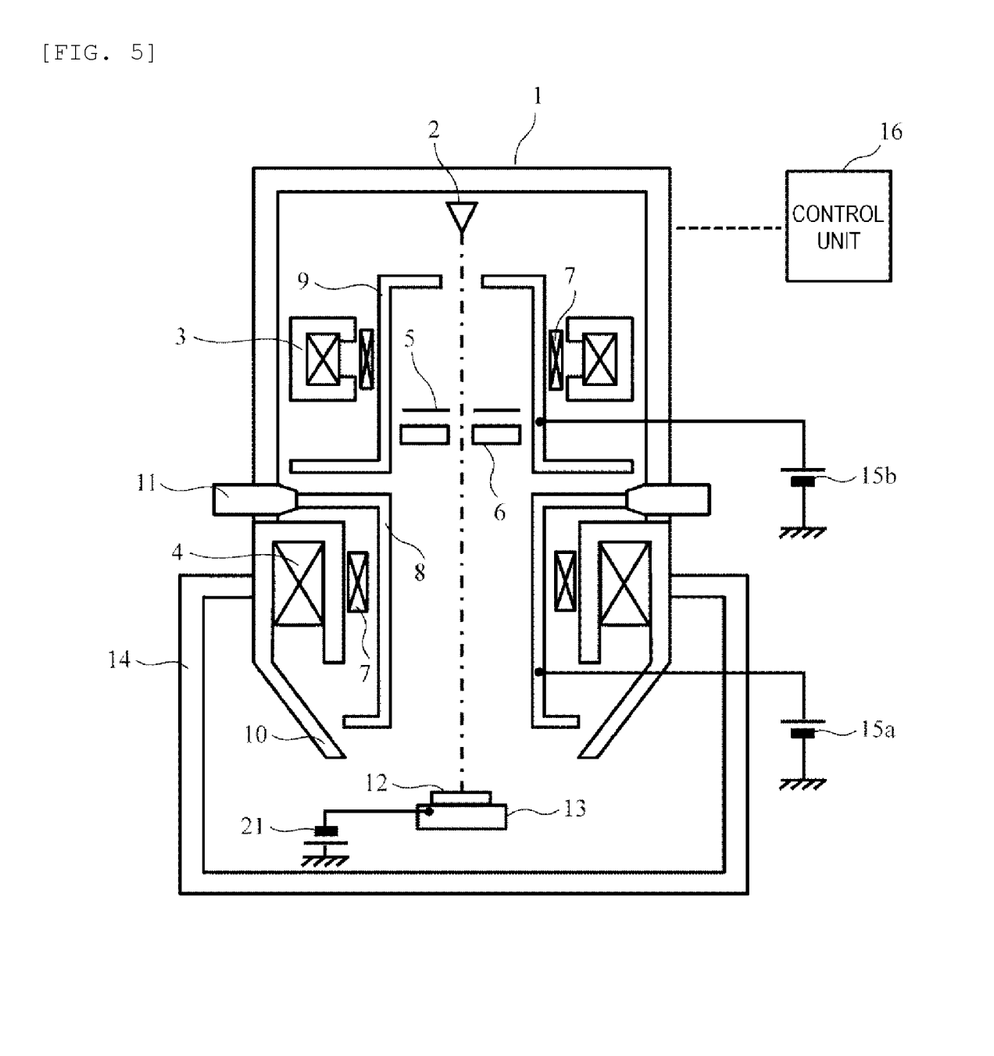
FIG. 5 is a schematic cross-sectional view showing a charged particle beam device according to a second embodiment.

FIG. 5 is a schematic configuration diagram showing a charged particle beam device according to the second embodiment. The sample table 13 includes a retarding voltage source 21 that can apply a voltage to the sample 12. The voltage from the voltage source 21 may be controlled by the control unit 16. Typically, the SEM column 1 and the first beam tube 8 and the second beam tube 9 that are in the column are set to the ground potential, and a negative voltage is applied to the sample 12. Thus, the decelerating electric field for the probe electron beam occurs between the sample-side end portion of the first beam tube 8 and the sample 12, and the resolution of the SEM can be improved. It is desirable that the negative voltage applied to the sample 12 for improving the resolution is set such that the potential difference between the sample 12 and the first beam tube 8 is 1 kV or more, and the larger the potential difference, the greater a resolution improving effect. However, a suitable voltage value is not limited thereto since the voltage value may change depending on a working distance (WD) between the sample 12 and the tip portion of the objective lens 4.

In the present embodiment, the position of the deceleration lens to be superimposed on the magnetic field lens is determined by a positional relationship among the first beam tube 8, the tip portion of the objective lens and the sample 12. Therefore, the axis adjustment of the deceleration lens can be realized by moving the position of the first beam tube 8. In addition, similarly to the first embodiment, by setting the first beam tube 8 and the second beam tube 9 to the same potential during the adjustment, the axis adjustment can be performed for the deceleration lens alone. Therefore, by aligning a center axis of the deceleration lens with a center axis of the magnetic field lens and guiding the probe electron beam to a center axis of the superimposing lens, it is possible to reduce the off-axis aberrations and maximize the irradiation system performance.

The axis adjustment in the present embodiment can be performed, for example, by the procedure the same as in the first embodiment.

(1) At first, the probe electron beam trajectory is aligned with the current center axis of the objective lens 4 (the magnetic field lens). First, the objective lens 4 is driven to focus the probe electron beam on the sample 12. In this state, the excitation current of the objective lens coil is periodically changed, and the position of the electron source 2 or the deflector 7 is adjusted to change the probe electron beam trajectory in order to minimize the movement of the image.

Next, the condenser lens 3 is set to predetermined excitation, the excitation current supplied to the objective lens 4 is periodically changed again, and the position of the condenser lens 3 or the deflector 7 is adjusted to change the probe electron beam trajectory in order to minimize the movement of the image. Finally, the movable aperture 5 is inserted on the optical axis, and again, the excitation current supplied to the objective lens 4 is periodically changed and the position of the movable aperture 5 is adjusted in order to minimize the movement of the image.

(2) Second, the optical axis of the deceleration lens (the electrostatic lens) is aligned with the current center axis of the objective lens 4 (the magnetic field lens). The objective lens 4 and the condenser lens 3 are driven, the negative voltage is applied to the sample 12 and the probe electron beam is focused on the sample in a state where the aperture 5 is inserted. The excitation current of the objective lens 4 is periodically changed and the position of the first beam tube 8 is changed by the moving mechanism 11 in order to minimize the movement of the image. Thus, the current center axis of the objective lens 4 (the magnetic field lens) and the optical axis of the deceleration lens (the electrostatic lens) can be aligned with each other.

(3) In addition to the above adjustment, it is desirable to perform adjustment of aligning the current center axis of the objective lens 4 (the magnetic field lens) with a voltage center axis of the deceleration lens (the electrostatic lens). In this case, (3-1) the aperture 5 is moved or the deflector 7 is adjusted to change the probe electron beam trajectory in order to minimize the movement of the image caused by periodically changing a retarding voltage. (3-2) Next, the position of the first beam tube 8 is adjusted in order to minimize the movement of the image caused by periodically changing the excitation current supplied to the objective lens 4. (3-3) Procedures of the adjustment (3-1) and the adjustment (3-2) are performed repeatedly.

By the above adjustment (3), the current center axis of the magnetic field lens and the voltage center axis of the electrostatic lens are aligned, and the probe electron beam is adjusted to pass through the current center axis of the magnetic field lens and the voltage center axis of the electrostatic lens that are aligned.

As a modification of the present embodiment, a configuration may be employed in which a positive voltage is applied to the first beam tube 8 and the second beam tube 9 and the boosting method and the retarding method are used together. By applying the positive voltage having a polarity opposite to that of the retarding voltage to the first beam tube 8, the potential difference between the first beam tube 8 and the sample 12 is further increased, and further improvement of the irradiation system performance can be expected. In this case, the position of the deceleration lens to be superimposed on the magnetic field lens is also determined by the positional relationship among the first beam tube 8, the tip portion of the objective lens and the sample 12. Therefore, it is possible to realize the adjustment for aligning the axis of the electrostatic lens with the axis of the magnetic field lens by moving the position of the first beam tube 8.

On the other hand, a configuration may be employed in which when a general retarding method is applied and the voltage applied to the beam tube is set to the ground voltage, the first beam tube 8 in FIG. 5 is replaced with an electrode for generating the decelerating electric field between the electrode and the sample, and the second beam tube 9 is removed. In this case, the position of the deceleration lens to be superimposed on the magnetic field lens is also determined by the positional relationship among the electrode 8, the tip portion of the objective lens and the sample 12. Therefore, it is possible to realize the adjustment for aligning the axis of the electrostatic lens with the axis of the magnetic field lens by moving the position of the electrode 8. The electrode 8 can be a cylindrical electrode including an opening through which the probe electron beam passes or a disc electrode.

The invention is not limited to the above embodiments and includes various modifications. The embodiments described above have been described in detail for easy understanding of the invention, and are not necessarily limited to those including all the configurations described above. In addition, partial configuration of one embodiment may be replaced with the configuration of another embodiment. In addition, the configuration of another embodiment can be added to the configuration of one embodiment. In addition, with respect to partial configuration of each embodiment, other configurations can be added, deleted, or replaced. For example, although the SEM is described as an embodiment, the invention is applicable to other charged particle beam devices and also to a composite charged particle beam device in which a plurality of charged particle beam devices are combined.

REFERENCE SIGN LIST

1 SEM column
2 electron source
3 condenser lens
4 objective lens
5 aperture
6, 6' detector
7 deflector
8 first beam tube (electrode)
9 second beam tube
10 deceleration electrode
11 moving mechanism
12 sample
13 sample table
14 sample chamber
15 boosting voltage source
16 control unit
17 beam tube
18 intermediate beam tube
21 retarding voltage source

The invention claimed is:

1. A charged particle beam device, comprising:
   an electron source;
   an objective lens that focuses a probe electron beam from the electron source on a sample;
   a first beam tube and a second beam tube through each of which the probe electron beam passes;
   a deceleration electrode arranged between the sample and the first beam tube arranged closer to an objective lens side than the second beam tube;
   a first voltage source that forms a deceleration electric field for the probe electron beam between the first beam tube and the deceleration electrode by applying a first potential to the first beam tube; and
   a first moving mechanism that moves a position of the first beam tube.

2. The charged particle beam device according to claim 1, wherein
   the first voltage source applies the first potential to the first beam tube and the second beam tube.

3. The charged particle beam device according to claim 1, further comprising:
   a second voltage source that forms an accelerating electric field for the probe electron beam between the second beam tube and the electron source by applying a second potential to the second beam tube; wherein
   the first voltage source and the second voltage source are controlled in a mode such that the first potential and the second potential are set to the same potential.

4. The charged particle beam device according to claim 1, wherein the deceleration electrode is magnetically coupled to a magnetic path of the objective lens.

5. The charged particle beam device according to claim 1, wherein the first beam tube includes a flange portion at an end portion on an electron source side,
   the second beam tube includes a flange portion at an end portion on an objective lens side, and
   the flange portion of the first beam tube and the flange portion of the second beam tube are arranged so as to face each other.

6. The charged particle beam device according to claim 1, wherein
   the first beam tube is electrically insulated from the deceleration electrode via a space or an insulator.

7. The charged particle beam device according to claim 1, further comprising:
   a column in which the first beam tube is incorporated, wherein
   the first moving mechanism is capable of moving the position of the first beam tube from an outside of the column.

8. The charged particle beam device according to claim 1, further comprising:
- a third beam tube that is arranged between the first beam tube and the second beam tube and through which the probe electron beam passes;
- a second voltage source that forms an acceleration electric field for the probe electron beam between the second beam tube and the electron source by applying a second potential to the second beam tube;
- a third voltage source that applies a third potential to the third beam tube; and
- a second moving mechanism that moves a position of the third beam tube; wherein
- the first voltage source and the third voltage source are controlled in a mode such that the first potential and the third potential are set to the same potential; and the second voltage source and the third voltage source are controlled in a mode such that the second potential and the third potential are set to the same potential.

\* \* \* \* \*